(12) United States Patent
Lee et al.

(10) Patent No.: US 9,075,311 B2
(45) Date of Patent: Jul. 7, 2015

(54) MANUFACTURING METHOD OF MICROSTRUCTURE

(71) Applicant: NATIONAL CHENG KUNG UNIVERSITY, Tainan (TW)

(72) Inventors: Yung-Chun Lee, Tainan (TW); Chi-Cheng Chiu, Changzhi Township, Pingtung County (TW); Chih-Hao Chang, Yuanlin Township, Changhua County (TW); Ching-Yun Lu, Taipei (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 163 days.

(21) Appl. No.: 13/850,467

(22) Filed: Mar. 26, 2013

(65) Prior Publication Data

US 2014/0295354 A1 Oct. 2, 2014

(51) Int. Cl.
G06F 17/50 (2006.01)
G03F 7/20 (2006.01)

(52) U.S. Cl.
CPC .............. *G03F 7/20* (2013.01); *G03F 7/70425* (2013.01); *G03F 7/70733* (2013.01)

(58) Field of Classification Search
USPC .................................................. 716/50–54
See application file for complete search history.

(56) References Cited

U.S. PATENT DOCUMENTS

2004/0027675 A1* 2/2004 Wu et al. .................... 359/619
2012/0005634 A1* 1/2012 Seltmann et al. ............ 716/53

OTHER PUBLICATIONS

Chiu, Chi-Cheng, "Development of Excimer Laser Micromachining System for fabricating Microlens Array and Its Application", National Cheng Kung University, Electronic Theses & Dissertations Service, pp. 1-7 (2012).

* cited by examiner

*Primary Examiner* — Binh Tat
(74) *Attorney, Agent, or Firm* — Muncy, Geissler, Olds & Lowe, P.C.

(57) ABSTRACT

A manufacturing method of microstructure comprises steps of: a motion determination step which determines the motion of a substrate relative to at least a photomask; a microlens determination step which determines the profile of a microlens unit on the substrate; an analysis step which calculates the feature of the photomask according to the motion of the substrate and the profile of the microlens unit by using a numerical analysis method; a production step which produces the photomask according to the feature of the photomask; driving the substrate to do the motion determined in the motion determination step, and meanwhile making a laser light illuminate the substrate through the photomask to manufacture the microlens unit on the substrate by the superposition effect of the laser light; and performing a photolithography process by using the microlens unit to produce a microstructure on a photoresist substrate.

20 Claims, 19 Drawing Sheets

MANUFACTURING METHOD OF MICROSTRUCTURE

BACKGROUND OF THE INVENTION

1. Field of Invention

The invention relates to a manufacturing method of microstructure and, in particular, to a manufacturing method of microstructure wherein the microstructure is produced by focal light spots through a microlens unit.

2. Related Art

The laser dragging process uses the photomask projection method cooperated with a precise displacement platform to allow the pattern on the photomask to be superposed on a surface of a substrate in different directions and depths so as to produce various 3D microstructures rapidly and largely. Because the profile of the microstructure is totally determined by the transparent pattern of the photomask, the design of the photomask is the most crucial of all parts for the laser dragging process.

The laser dragging process is most frequently used for producing a microlens array. However, since the photomask pattern is defined by quadratic curves and only the orthogonal two-dimensional dragging is used in the process, the profile of the produced microlens can not be accurately determined. Hence, such inaccurate microlens structure produced by the laser dragging process that has not been optimized can not fit the desired profile, thus unable to be effectively applied to the industry.

Therefore, it is an important subject to provide a manufacturing method of microstructure that can produce a microlens unit (such as an array) with the desired and accurate profile so as to enhance the applicability of the microstructure.

SUMMARY OF THE INVENTION

In view of the foregoing subject, an objective of the invention is to provide a manufacturing method of microstructure that can produce microlens units with accurate profiles and then produce various microstructures with desired profiles by the obtained microlens units.

To achieve the above objective, a manufacturing method of microstructure according to the invention comprises steps of: a motion determination step which determines the motion of a substrate relative to at least a photomask; a microlens determination step which determines the profile of a microlens unit on the substrate; an analysis step which calculates the feature of the photomask according to the motion of the substrate and the profile of the microlens unit by using a numerical analysis method; a production step which produces the photomask according to the feature of the photomask; driving the substrate to do the motion determined in the motion determination step, and meanwhile making a laser light illuminate the substrate through the photomask to manufacture the microlens unit on the substrate by the superposition effect of the laser light; and performing a photolithography process by using the microlens unit to produce a microstructure on a photoresist substrate.

In one embodiment, the motion of the substrate includes the angle and number of times of moving, the angle and number of times of rotating, or their combination.

In one embodiment, the motion determination step further determines the number of times of the substrate's motion relative to the photomask, and the analysis step calculates the feature of the photomask further according to the number of times by using the numerical analysis method.

In one embodiment, the substrate moves or rotates according to at least two directions relative to the photomask in the motion determination step, and two of the directions form an angle.

In one embodiment, the substrate moves or rotates at least two times relative to the photomask in the motion determination step.

In one embodiment, the substrate moves or rotates according to at least a direction relative to a plurality of the photomasks in the motion determination step.

In one embodiment, the substrate moves or rotates at least one time relative to a plurality of the photomasks in the motion determination step.

In one embodiment, the profile of the microlens unit includes an ellipse, a cone, a pyramid, an asymmetric form, an aspheric surface, an axisymmetric form, a cubic close-packed form, or their any combination.

In one embodiment, the profile of the microlens unit is represented by at least an equation.

In one embodiment, the microlens unit is a microlens array.

In one embodiment, the microlens unit is a hexagonal close-packed microlens array.

In one embodiment, the micro lens unit includes a plurality of aspheric microlenses.

In one embodiment, the aspheric microlenses include a plano-convex aspheric microlens, a biconvex aspheric microlens, or their combination.

In one embodiment, the numerical analysis method includes the simplex method.

In one embodiment, the manufacturing method further comprises the step of: a laser light determination step which determines the intensity and illumination time of a laser light, and the feature of the photomask is obtained by using the numerical analysis method further according to the intensity and the illumination time of the laser light in the analysis step.

In one embodiment, the photolithography process includes focusing a light into at least a light spot through the microlens unit, and the light spot falls on the photoresist substrate.

In one embodiment, the light spot approximates to the optical diffraction limit thereof.

In one embodiment, the photolithography process includes driving the photoresist substrate to move, rotate, or move and rotate according to at least a direction.

In one embodiment, the microstructure is a microstructure array.

In one embodiment, the microstructure includes a polyhedral microstructure, an axisymmetric microstructure, a pyramid microstructure, a light-guiding microstructure, an anti-counterfeiting microstructure, an optical reflective microstructure, or their any combination.

As mentioned above, in the manufacturing method according to the invention, different from the traditional art, the motion of a substrate relative to at least a photomask is determined in advance, such as including the angle, distance and number of times of moving and rotating, and also the profile feature of a microlens unit to be formed on the substrate is determined Then, a numerical analysis method is used to calculate and obtain the feature of the required photomask according to the determined motion of the substrate and the determined profile of the microlens unit so that the photomask can be manufactured according to the obtained feature of the photomask. After manufacturing the photomask, the substrate is driven to do the motion determined in the motion determination step, and meanwhile, a laser light is emitted to illuminate the substrate through the photomask, and then the microlens unit, i.e. expected microlens unit, will be formed on the substrate by the superposition effect of the laser light.

Subsequently, by using the microlens unit with the photolithography process, the desirable microstructure can be manufactured in conformity with the requirement. Therefore, the applicability of the microstructure can be enhanced a lot.

Besides, the complexity of the microlens unit to be manufactured can be raised for the sake of the method of the invention, and therefore the microlens unit with more complexity such as an ellipse, a cone, a pyramid, a symmetric form or an asymmetric form can be manufactured. In addition, the number of dimensions of the dragging can be increased, and for example, three-time dragging can be used for getting more dimensions of the superposition effect contributed by the transparent area of the photomask. Thereby, the hexagonal close-packed microlens array can be manufactured, allowing the filling rate of the structure to be increased. The crucial point of the invention is, the microlens unit with the pre-designed profile can be accurately manufactured, thereby bringing enormous economic value and applicability.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
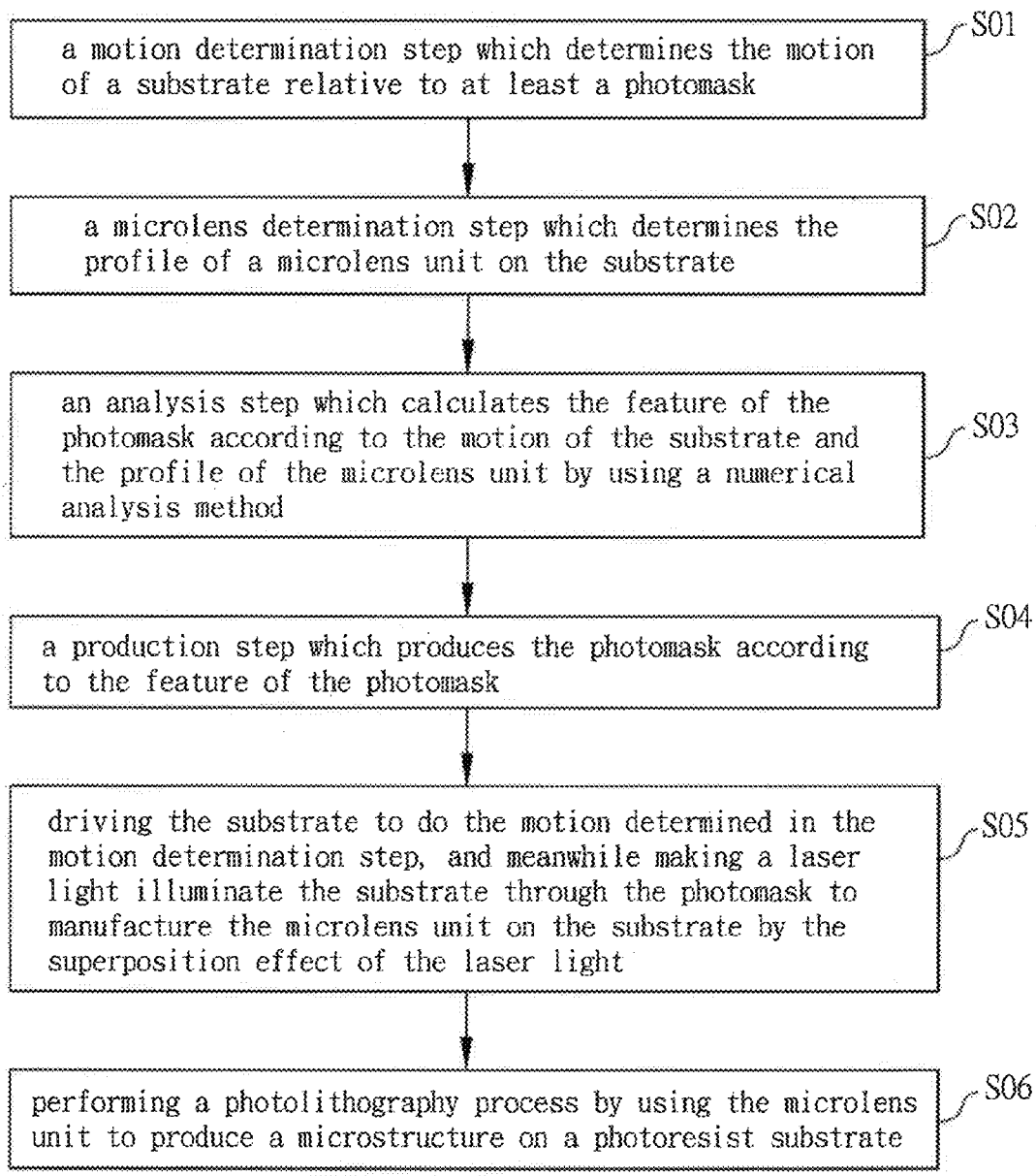
FIG. 1 is a flow chart of a manufacturing method of microstructure according to a preferred embodiment of the invention.

FIG. 1 is a flow chart of a manufacturing method of microstructure according to a preferred embodiment of the invention. The manufacturing method of microstructure of this embodiment can be mainly divided into two parts, the first part concerning the manufacturing of the photomask and the microlens unit and the second part concerning the microstructure manufactured by using the microlens unit. The first part is described as below first.

Figure 2:
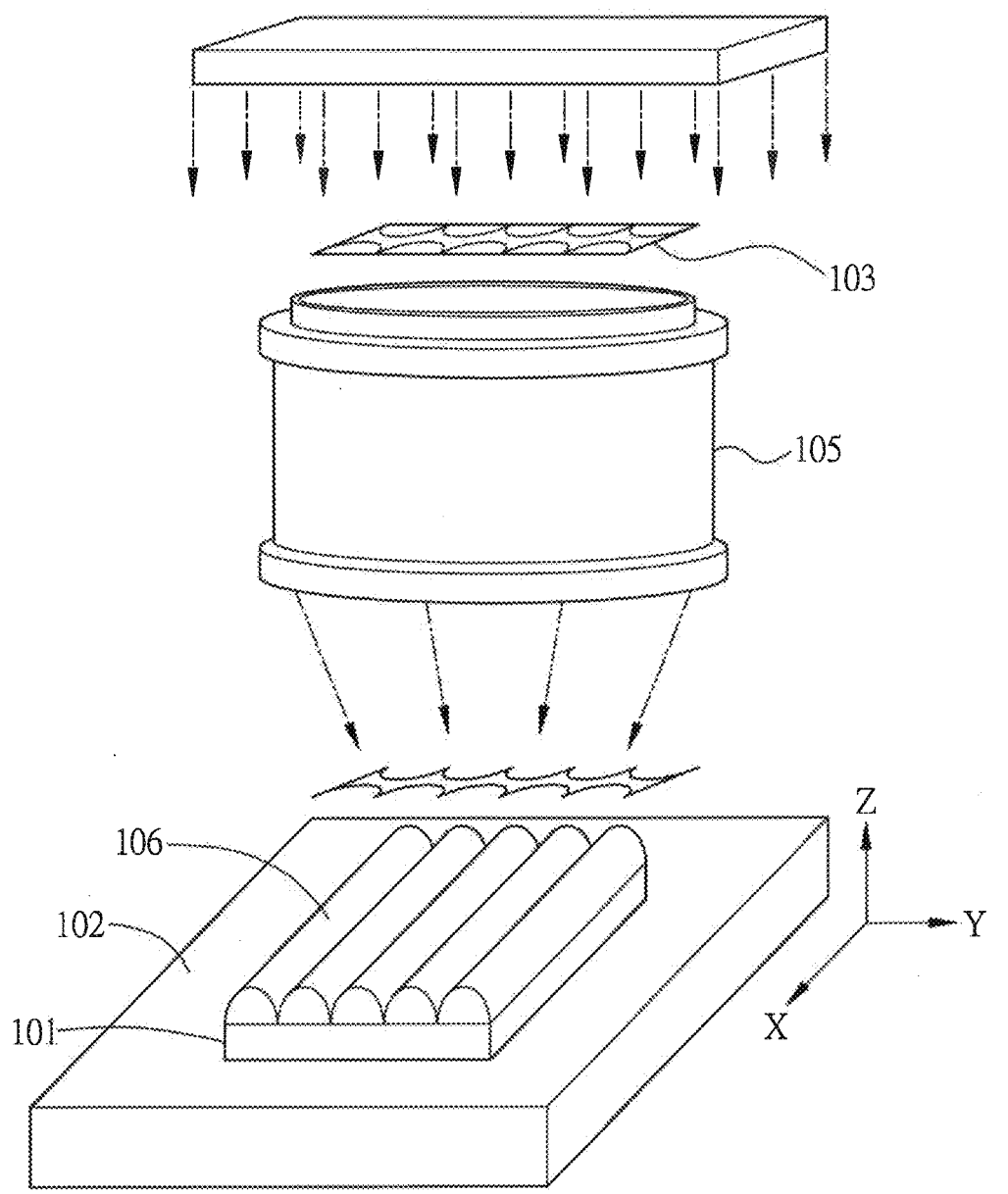
FIGS. 2 and 3 are schematic diagrams showing the manufacturing of the photomask and the microlens unit.

In this embodiment, the photomask and the micro lens unit are manufactured by the laser dragging process (LDP). FIG. 2 is a schematic diagram showing the manufacturing of the photomask and the microlens unit. The laser dragging process is briefly introduced first hereinafter. The laser dragging process uses the photomask projection method cooperated with a precise displacement platform to allow the pattern on the photomask to be superposed on a surface of a substrate in different directions and depths so as to produce various 3D microstructures. In this embodiment, the microstructure is instanced as a microlens unit. The manufacturing of the photomask and the micro lens unit is illustrated as below by referring to FIGS. 1 and 2.

First of all, the step S01 is a motion determination step which determines the motion of a substrate 101 relative to at least a photomask 103. Herein, the substrate 101 is disposed on a platform 102 which can move or rotate on multiple axes, such as X axis, Y axis or Z axis, or on any plane. By the motion of the platform 102, the substrate 101 disposed on the platform 102 moves accordingly. Besides, since the photomask 103 is fixed, the substrate 101 moves relative to the photomask 103. The motion of the substrate 101 can include the angle and number of times of moving, the angle and number of times of rotating, or their any combination, i.e. all possible motion.

Accordingly, the angle and number of times of the motion of the substrate 101 relative to the photomask 103 are determined beforehand, including the angle and number of times of moving, and the angle and number of times of rotating. To be noted, the aforementioned angle or number of times can be zero, and that is, the substrate may merely move or rotate. Some examples of the substrate's motion are illustrated as below. For example, the substrate 101 moves or rotates on at least two directions relative to the photomask 103, and the directions form an angle; the substrate 101 moves or rotates at least two times; the substrate 101 moves or rotates on at least a direction relative to "a plurality of" photomasks; or the substrate 101 moves or rotates at least one time relative to a plurality of photomasks.

Furthermore, in an embodiment, the platform 102 is driven to allow the substrate 101 to move on X axis first and then on Y axis, and that is the dragging for two times (or called two-time dragging hereinafter). Otherwise, the platform 102 is driven to allow the substrate 101 to move on a first direction, and then on a second direction that is counterclockwise for 120 degrees from the first direction, and then on a third direction that is counterclockwise for 120 degrees from the second direction, and that is the dragging for three times (or called three-time dragging). Of course, four-time, five-time, etc. dragging also can be applied to the invention.

The step S02 is a microlens determination step which determines the profile of a microlens unit on the substrate 101. In this step, the microlens unit has not been actually formed on the substrate 101 yet, but has just been designed. The profile of the microlens unit is not limited in the invention, which can be shaped like an ellipse, a cone, a pyramid, an asymmetric form, an aspheric surface, an axisymmetric form, a cubic close-packed form, or their any combination, for example. The profile can be represented by at least an equation. The microlens unit is, for example, a microlens array, such as a hexagonal close-packed microlens array. The microlens unit can include a plurality of aspheric microlenses, which include a plano-convex aspheric microlens, a biconvex aspheric microlens, or their combination, for example.

The step S03 is an analysis step which calculates the feature of the photomask according to the motion of the substrate 101 and the profile of the microlens unit by using a numerical analysis method. By the above-mentioned determination steps, the motion (such as the angle and number of times of moving and rotation) of the substrate and the profile feature of the desired microlens unit are determined Then, the feature of the required photomask can be calculated and obtained by the numerical analysis method. The numerical analysis method can be the simplex method, but the invention is not limited thereto. The feature of the photomask also can be represented by at least an equation.

The step S04 is a production step which produces the photomask according to the feature of the photomask. After obtaining the feature of the photomask, the photomask can be actually produced according to the feature thereof. The feature of the photomask can be simplified to the parameter solutions of the equation(s).

Because the feature of the photomask in the invention is solved under some pre-determined conditions by the numerical analysis method, more complicated situations also can be applied to the invention. For example, the situation of a plurality of photomasks can be applied to the invention, in addition to the multi-time dragging and multi-angle motion, Moreover, the manufacturing method can further include a laser light determination step which determines the intensity and illumination time of a laser light. In addition, the feature of the photomask can be obtained by using the numerical analysis method further according to the intensity and the illumination time of the laser light in the analysis step. The profile of the microlens unit will be affected with the variation of the intensity and the illumination time of the laser light, and therefore the intensity and the illumination time of the laser light also can be regarded as parameters. Accordingly, the intensity and the illumination time of the laser light are pre-determined in this embodiment, and the feature of at least a photomask can be obtained in the numerical analysis method according to the intensity and the illumination time of the laser light, and the angle and number of times of the moving of the substrate.

By the manufacturing method of the photomask of the above-mentioned embodiment, the required photomask(s) corresponding to the designed microlens unit can be produced. After that, the microlens unit can be manufactured by the produced photomask.

The step S05 is driving the substrate 101 to do the motion determined in the motion determination step, and meanwhile making a laser light illuminate the substrate through the photomask 103 to produce the microlens unit on the substrate 101 by the superposition effect of the laser light. As shown in FIG. 2, after producing the photomask 103, the substrate 101 is disposed on the platform 102, the photomask 103 is disposed above the substrate 101, and a projection lens 105 is disposed between the photomask 103 and the substrate 101. Subsequently, the substrate 101 carries out the motion determined in the motion determination step, and meanwhile, a laser light is emitted through the transparent area of the photomask 103 and the projection lens 105 to reach the substrate 101 for forming the microlens unit 106 by the superposition effect of the laser light.

Figure 4:
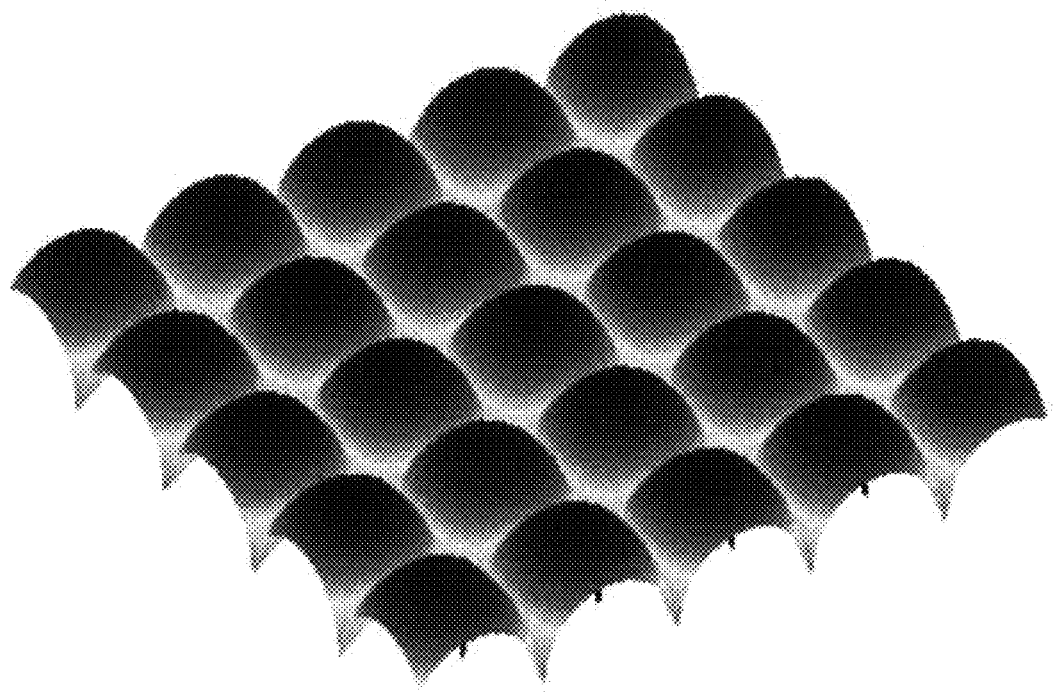
FIG. 4 is a schematic diagram of a microlens unit of an aspheric microlens array.
Figure 5:
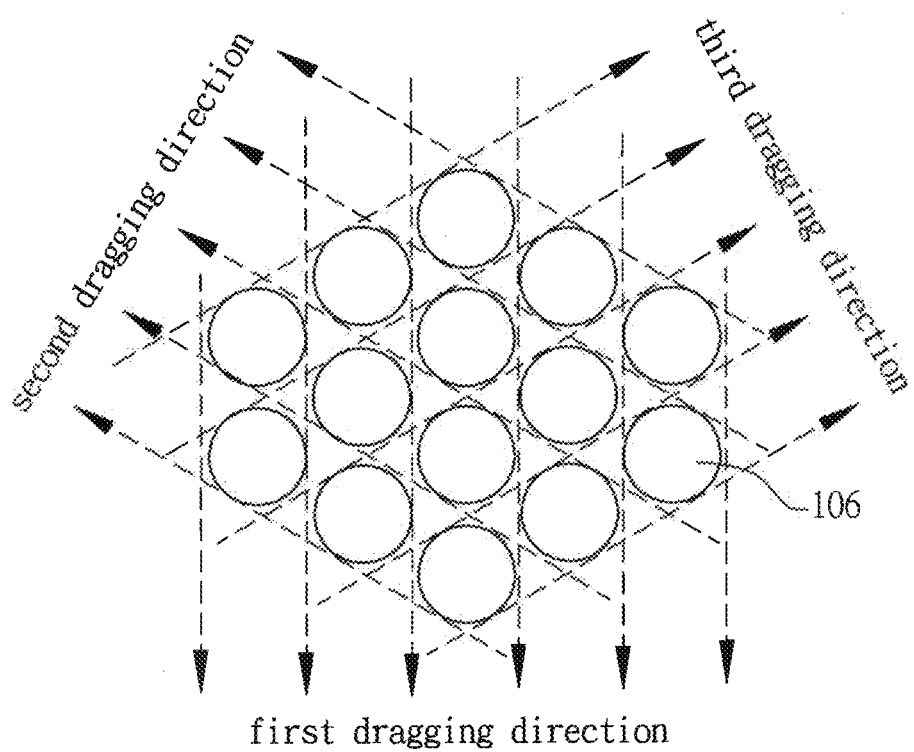
FIG. 5 is a schematic diagram of the laser dragging method of three-time dragging of a preferred embodiment of the invention.
Figure 6:
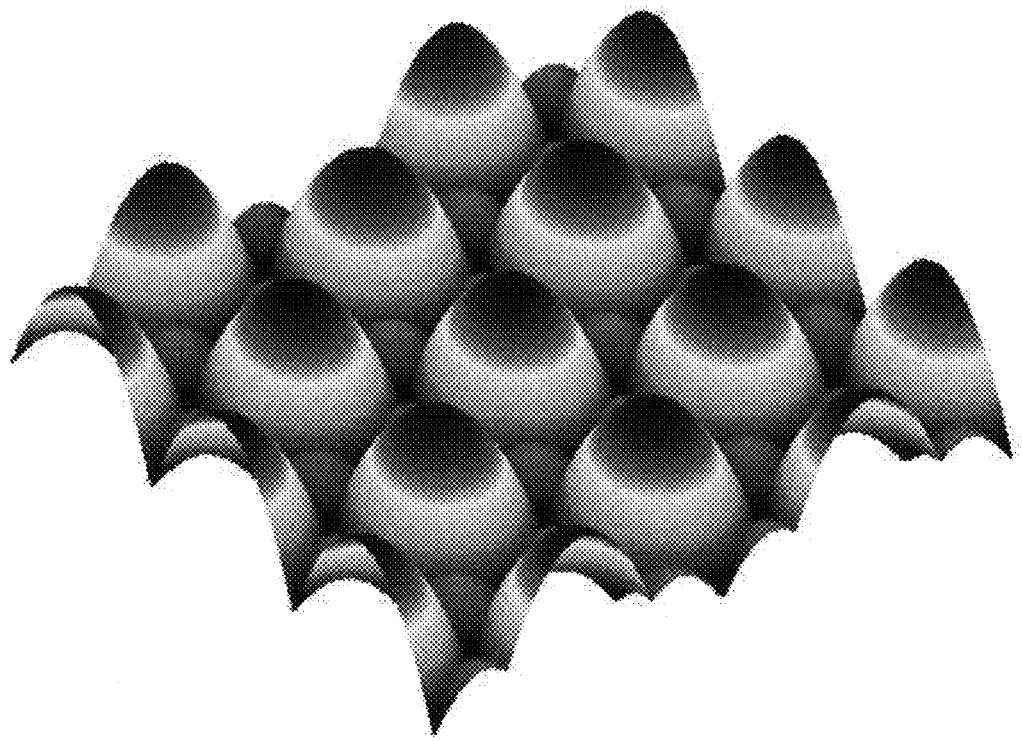
FIG. 6 is a schematic diagram of a microlens unit of a hexagonal close-packed microlens array.

In FIG. 2, in this embodiment, the substrate 101 carries out a two-dimensional movement relative to the photomask 103. First, the substrate 101 moves along the X axis, and then moves along the Y axis. Thereby, the microlenses of an aspheric micro lens array as shown in FIG. 4 are produced. Otherwise, in FIG. 5, the substrate 101 moves three times relative to the photomask 103, such as moving along a first dragging direction, a second dragging direction and a third dragging direction sequentially. Herein, the second dragging direction is +120° off the first dragging direction, and the third dragging direction is −120° off the first dragging direction. Thereby, the aspheric micro lens array can be formed into a hexagonal close-packed microlens array as shown in FIG. 6.

Figure 3:
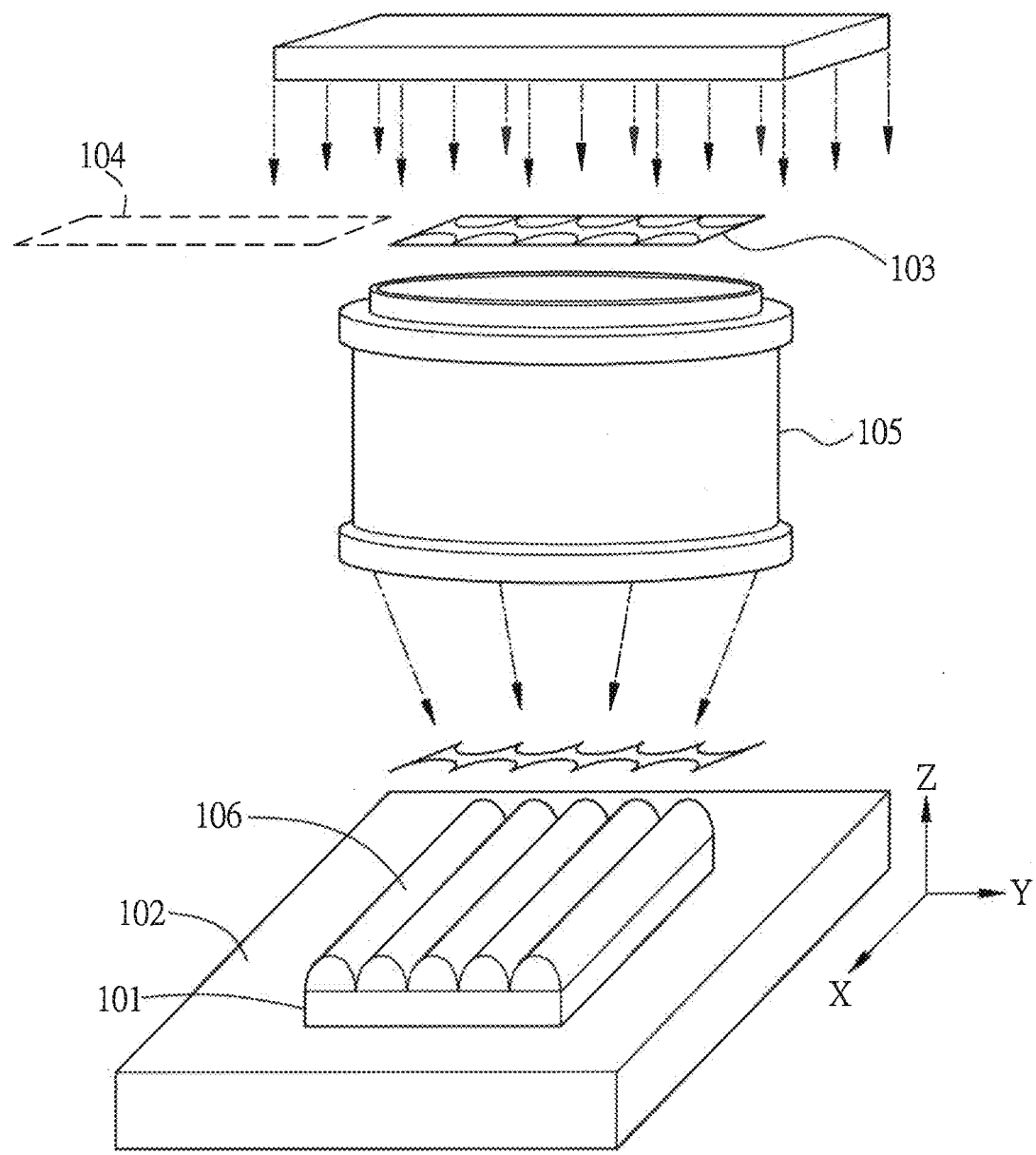

Otherwise, if the situation of a plurality of photomasks is considered in the motion determination step (as shown in FIG. 3), the replacement of the photomask needs to be executed in the manufacturing process of the microlens unit. Besides, if the intensity and the illumination time of the laser light are also considered, the laser light source may be adjusted according to the determined intensity and illumination time of the laser light in the manufacturing process of the microlens unit.

Other kinds of the microlenses that are produced by the laser dragging method of the invention are illustrated as below for example.

Figure 7A:
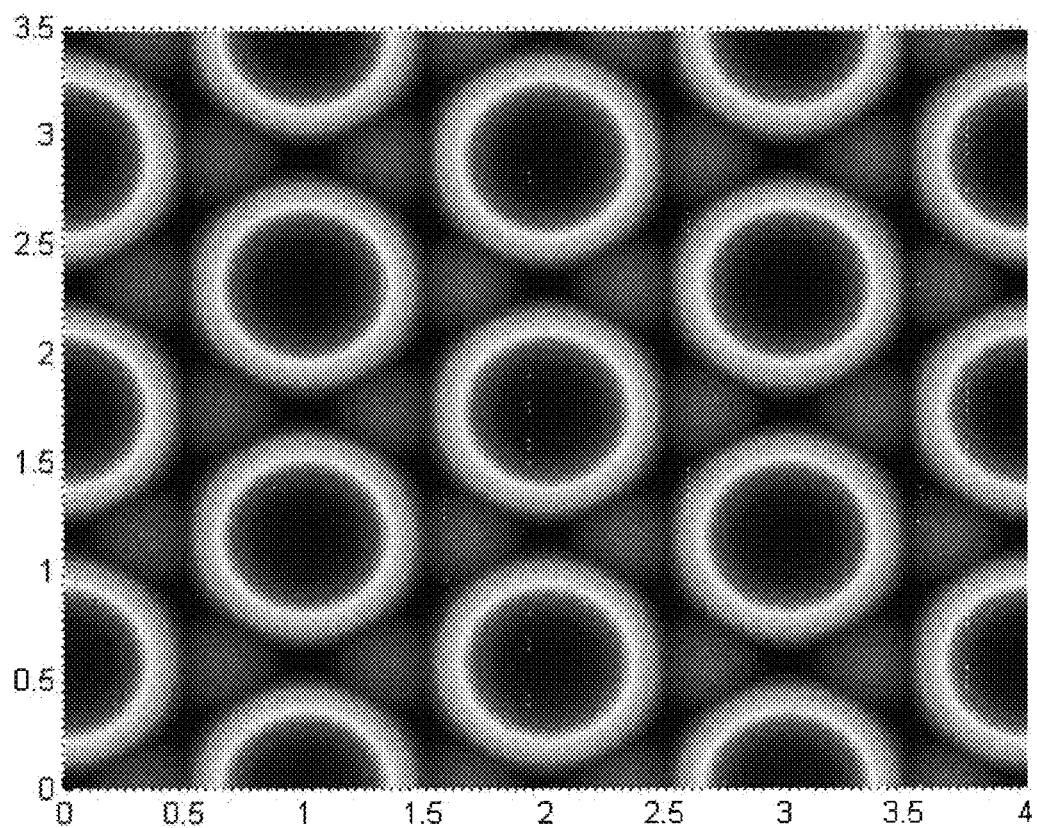
FIGS. 7A, 7B, 8A, 8B, 9A, 9B, 10A, 10B, 11A, and 11B are schematic diagrams of different types of the microlens unit according to a preferred embodiment of the invention.
Figure 7B:
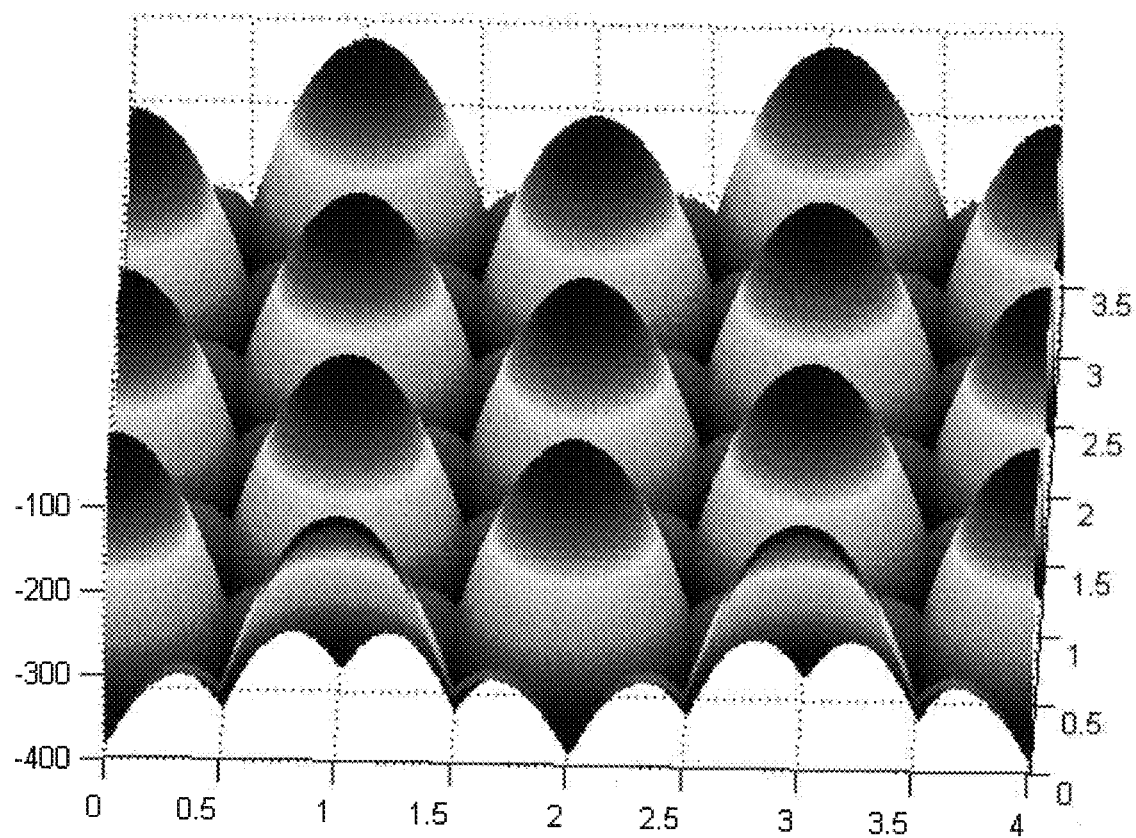
Figure 8A:
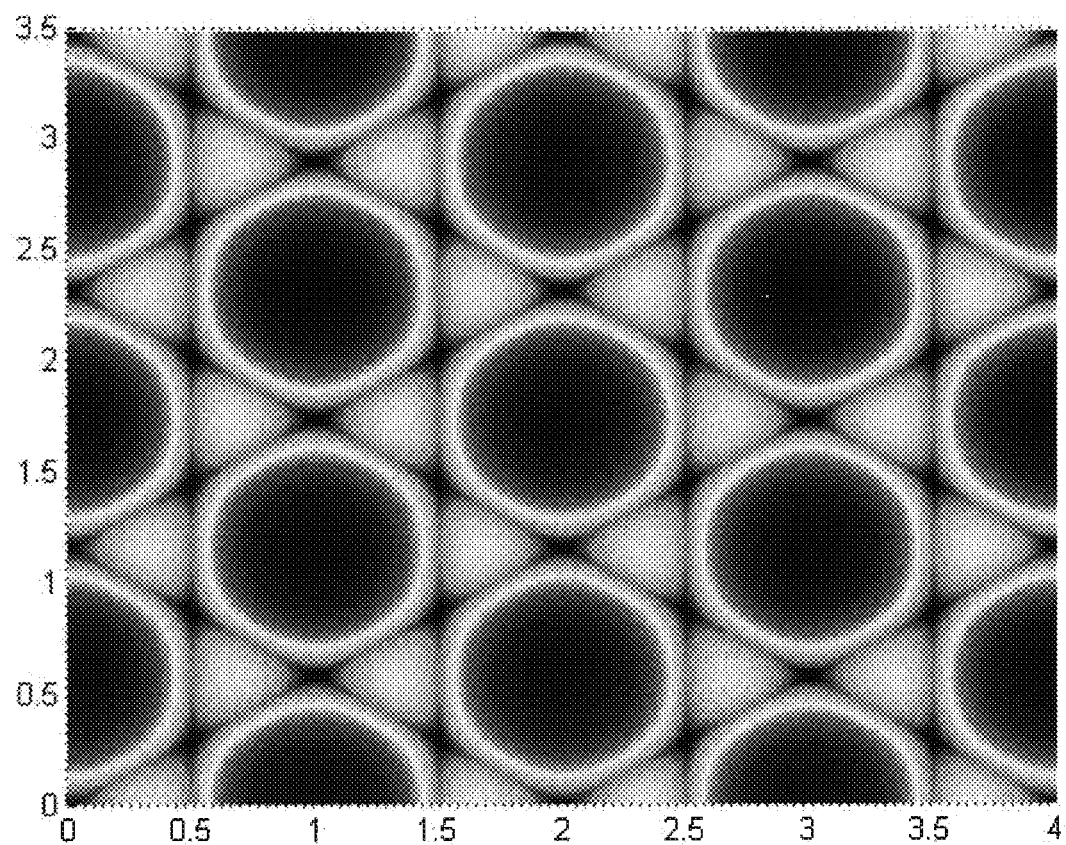
Figure 8B:
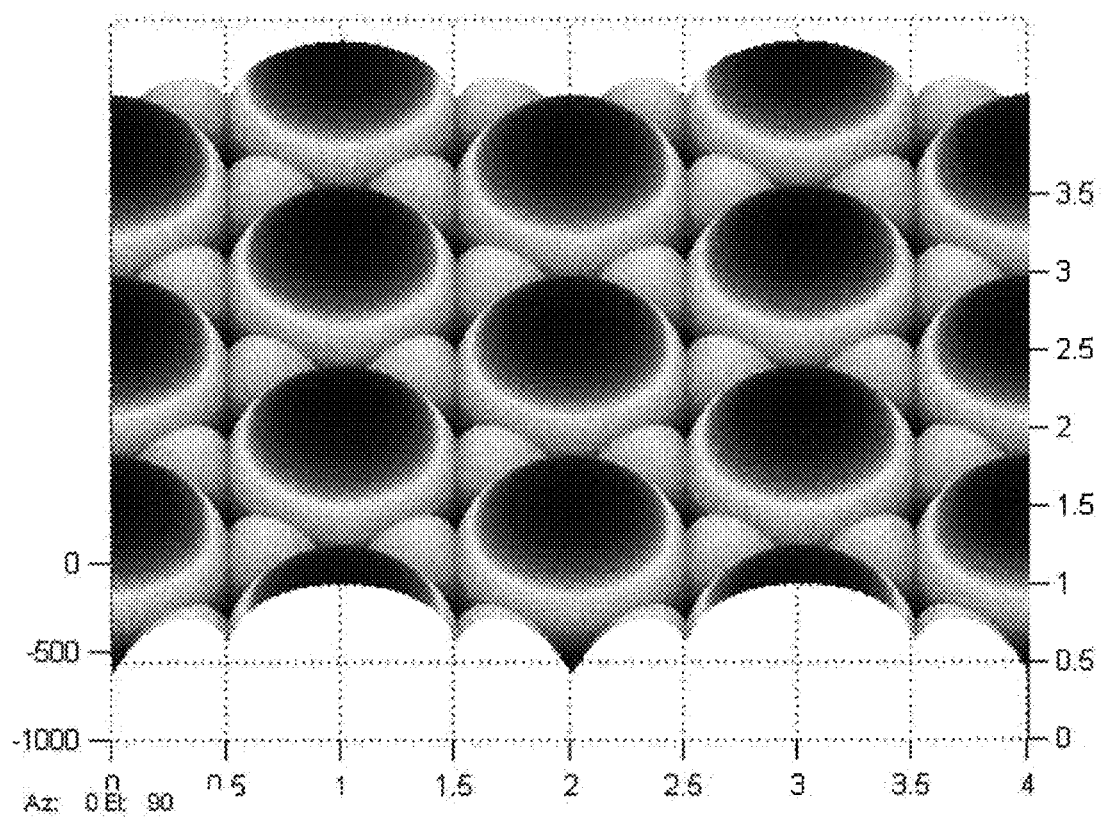

The microlens unit can be an axisymmetric microstructure, such as a bullet-type axisymmetric microstructure as shown in FIGS. 7A. (top view) and 7B, or a steamed-bun-type axisymmetric microstructure as shown in FIGS. 8A (top view) and 8B.

Figure 9A:
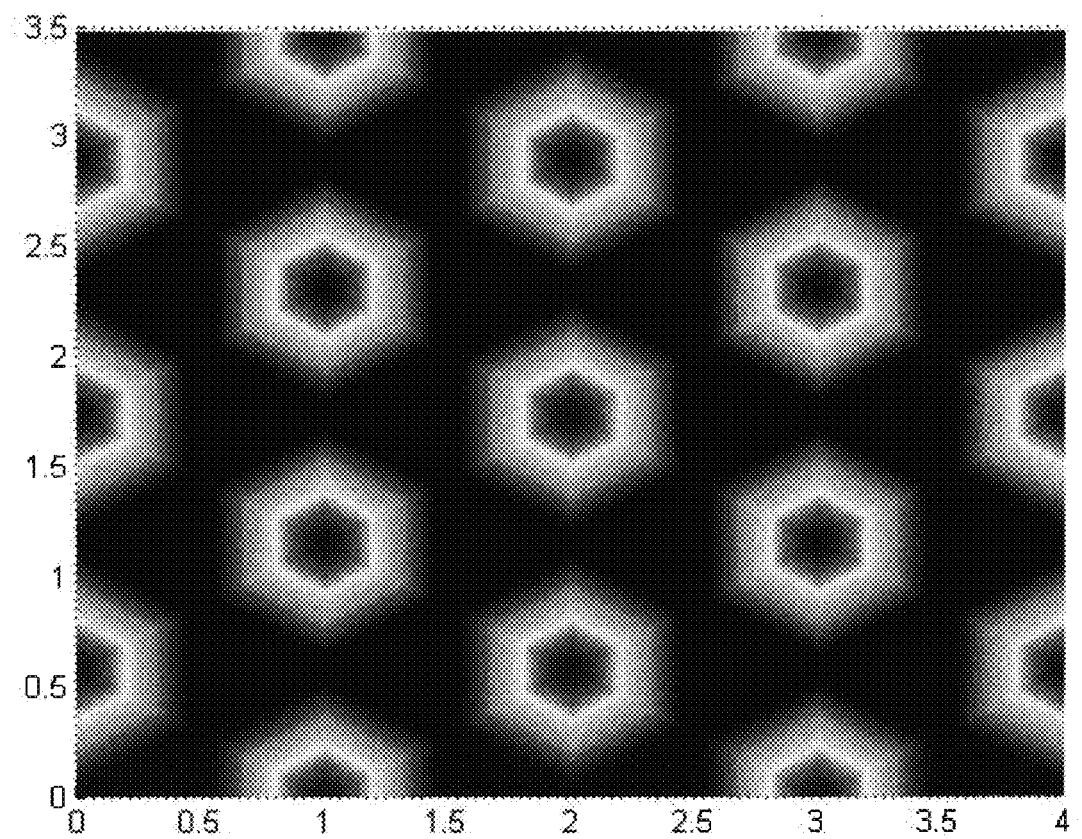
Figure 9B:
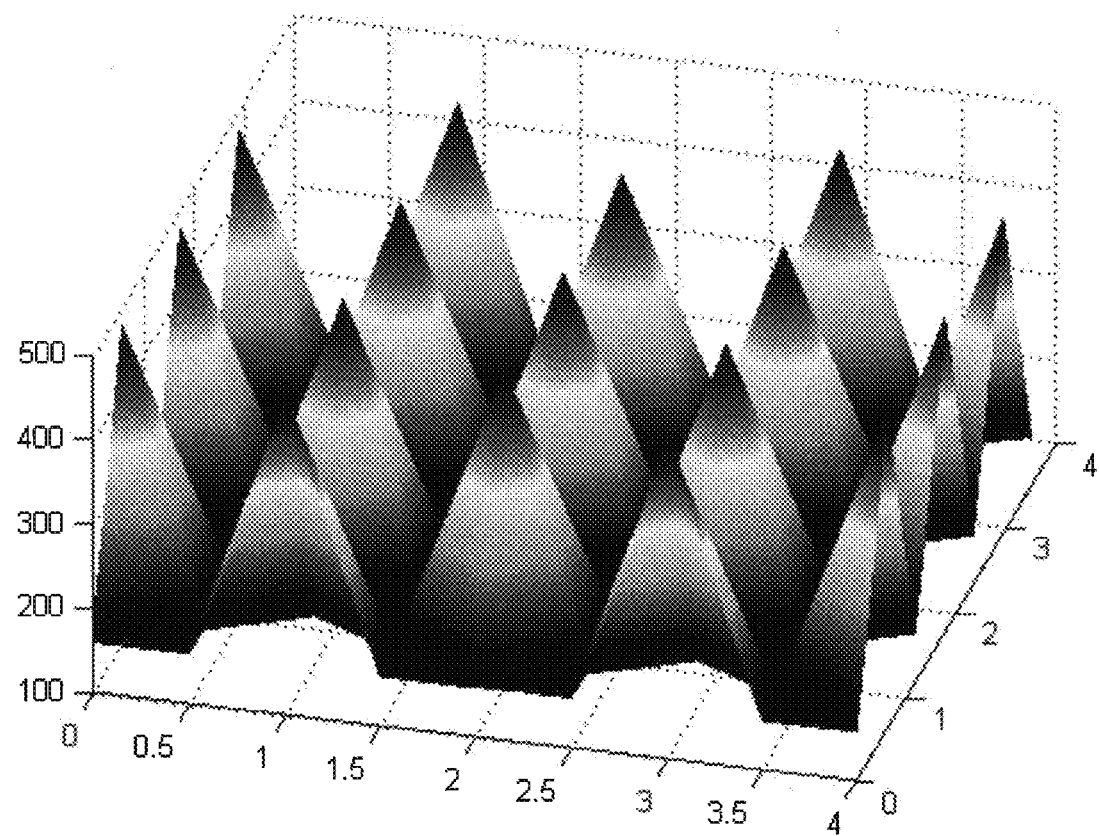
Figure 10A:
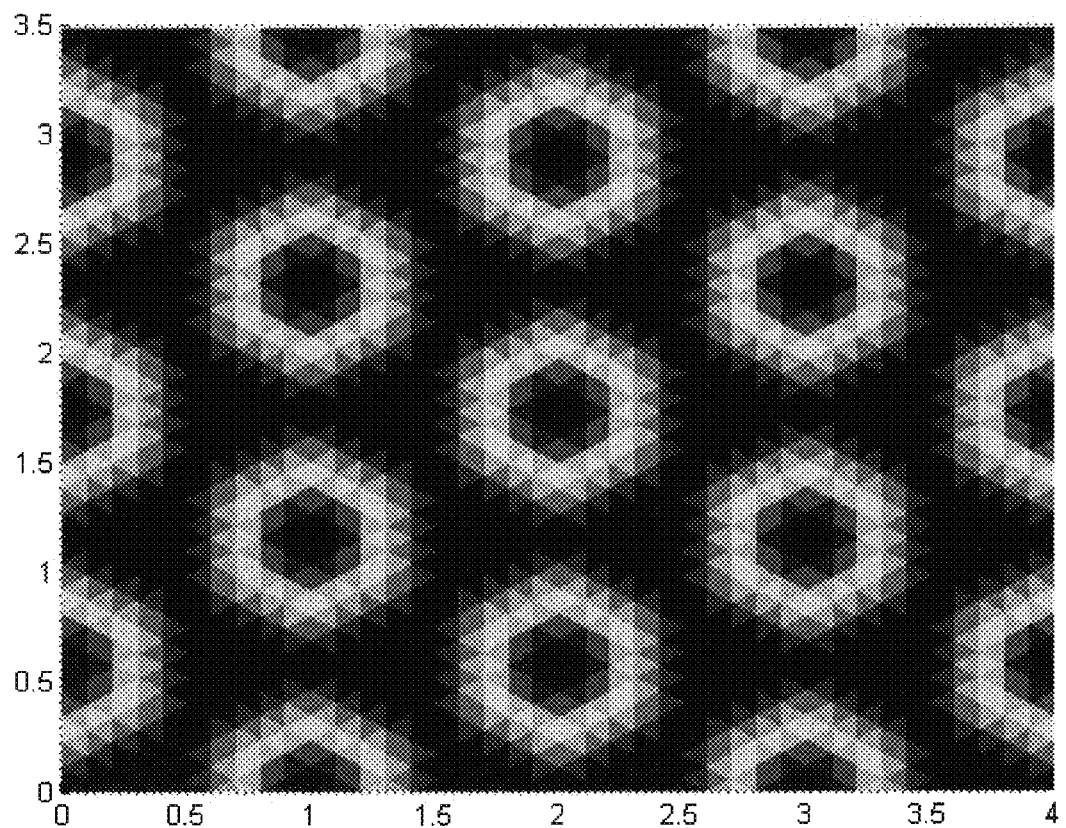
Figure 10B:
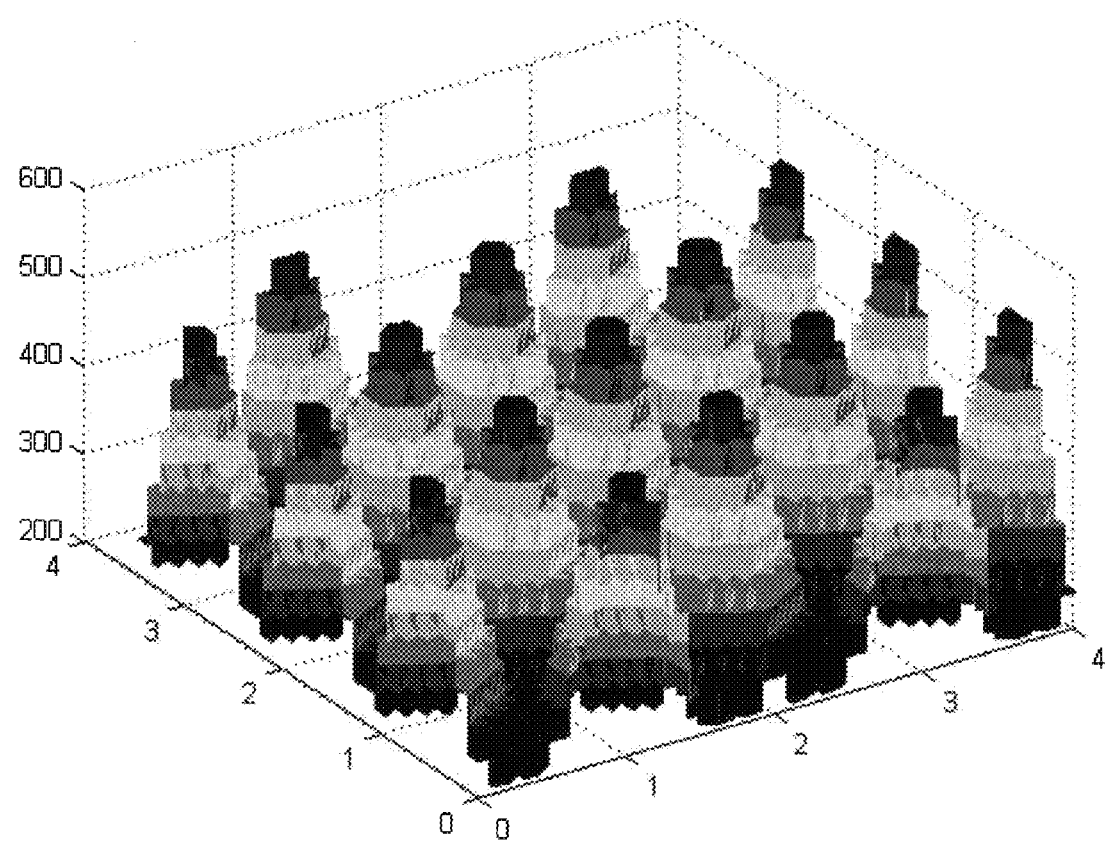
Figure 11A:
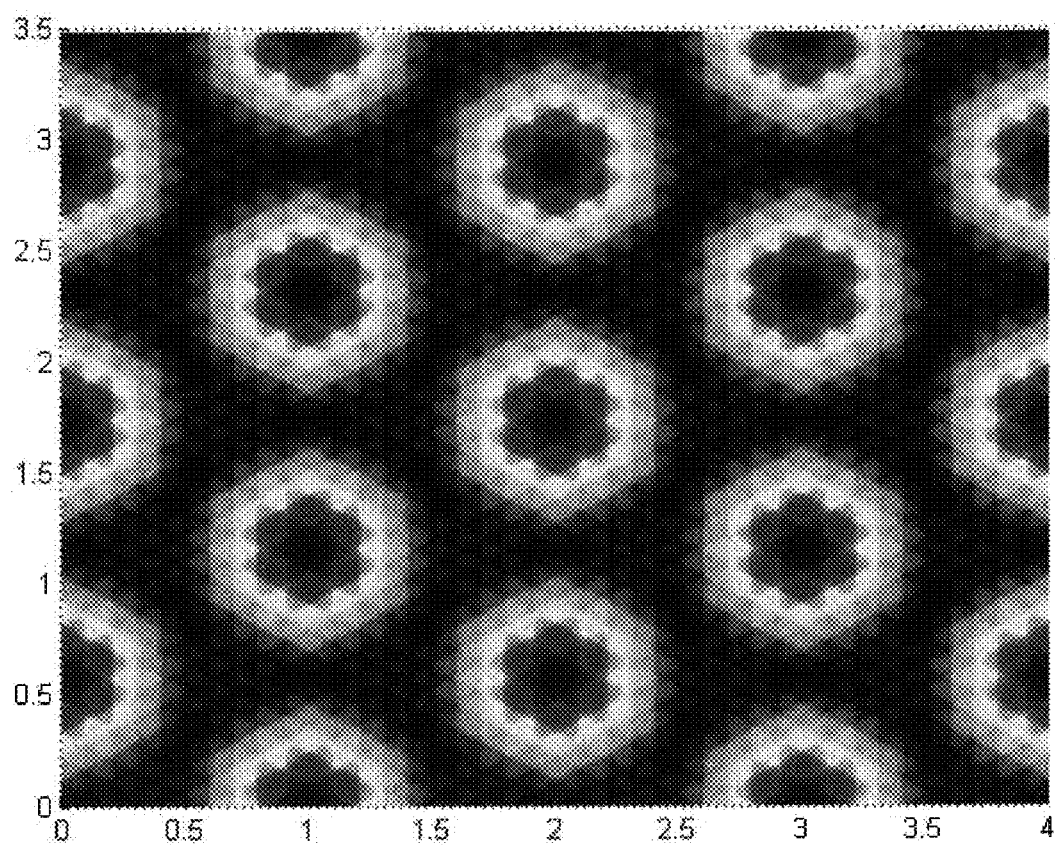
Figure 11B:
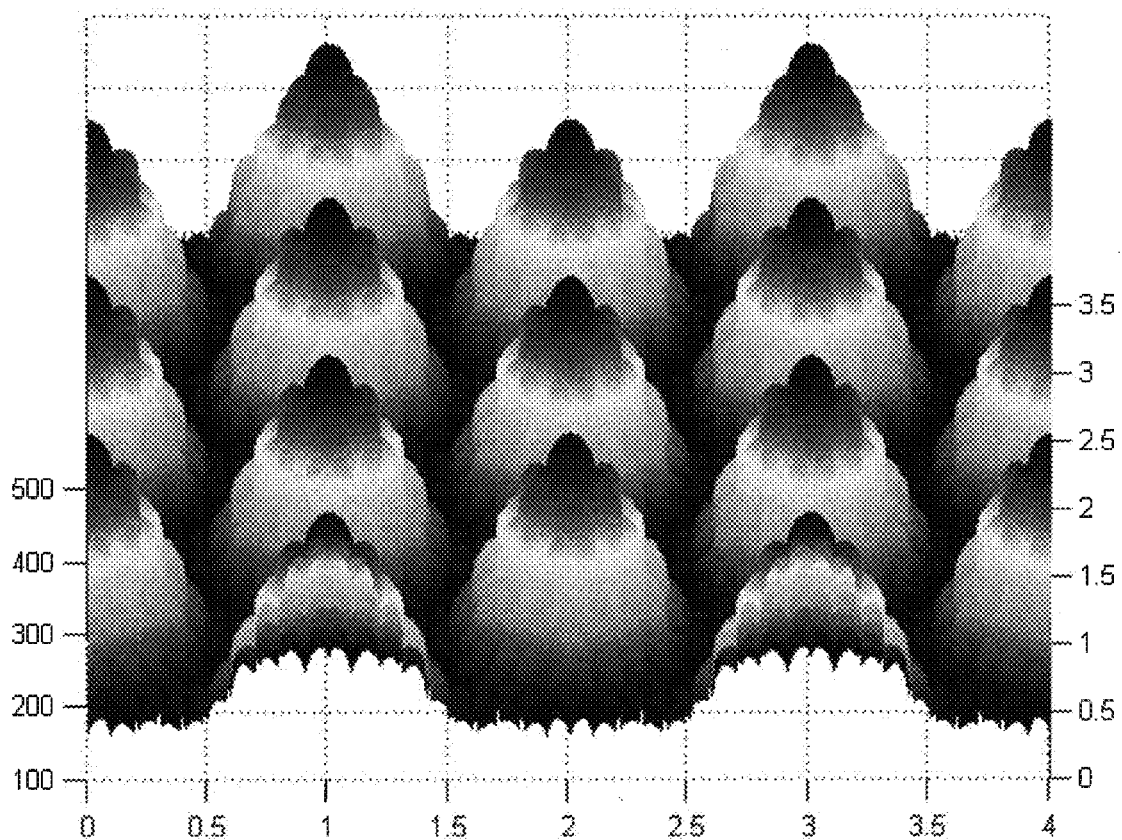

The microlens unit can be a polyhedral microstructure, such as a hexagonal pyramid microstructure as shown in FIGS. 9A (top view) and 9B, or a multi-layer pyramid microstructure as shown in FIGS. 10A (top view) and 10B, or a multi-layer curviform microstructure as shown in FIGS. 11A (top view) and 11B.

The following is the second part of this embodiment, i.e. the manufacturing of the microstructure by using the produced microlens unit.

The step S06 is performing a photolithography process by using the microlens unit to produce a microstructure on a photoresist substrate. Herein, the photoresist substrate means a substrate on which a photoresist layer can be formed. In the photolithography process, a light is focused to at least a light spot through the microlens unit, and the light spot falls on the photoresist substrate to result in a chemical reaction on the photoresist substrate for forming the patterned microstructure. In this embodiment, the microlens unit is an aspheric microlens array for example. Through the aspheric microlens array, the laser light is formed into light spots approximate to the optical diffraction limit, which is determined by the numerical aperture (NA) of the microlens and the wavelength (λ) of the applied light according to the formula: 1.22*λ/NA. For the microlens of this embodiment, the smallest optical diffraction limit can approximate to 0.6 μm to allow the microstructure to be manufactured with extremely small size and high precision. Besides, in the photolithography process, the photoresist substrate can move or rotate according to at least a direction for causing the multi-dimensional energy distribution that enables different types of the microstructure. The manufactured microstructure can be a microstructure array for example.

Figure 12:
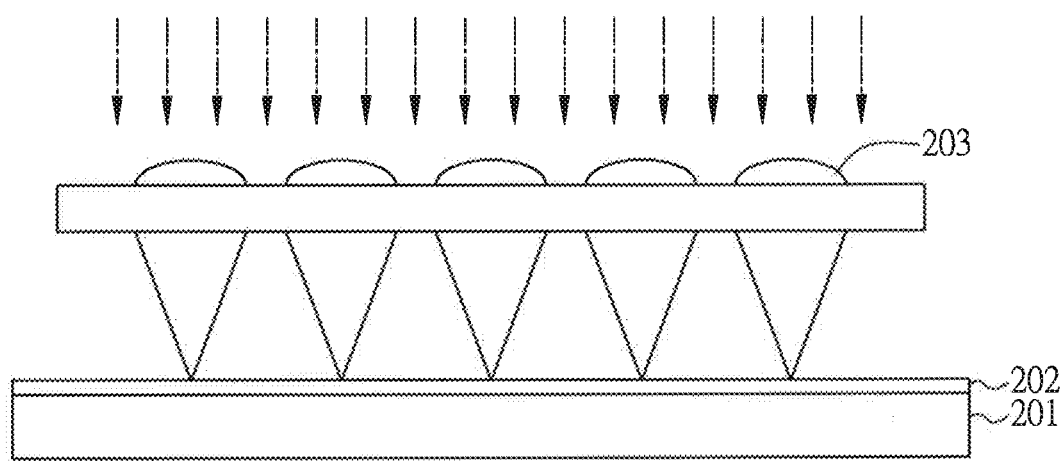
FIGS. 12 to 14 are schematic diagrams of the manufacturing of the microstructures according to a preferred embodiment of the invention.

FIG. 12 is a schematic diagram of the manufacturing of a microstructure according to a preferred embodiment of the invention. In FIG. 12, a photoresist substrate 201 is coated with a photoresist layer 202, and a laser light is focused to the photoresist layer 202 through a microlens unit 203. The microlens unit 203 can be any of the microlens units mentioned in all the above embodiments, and here is instanced as an aspheric microlens array capable of focusing the light to the smallest focal spots approximate to the optical diffraction limit. When the laser spots with large energy fall on the photoresist layer, the chemical reaction with dependency is caused in the illuminated area. Then, when the un-illuminated area of the photoresist layer is removed by a developer, the illuminated area of the photoresist layer will remain and be formed into a microstructure array.

Figure 13:
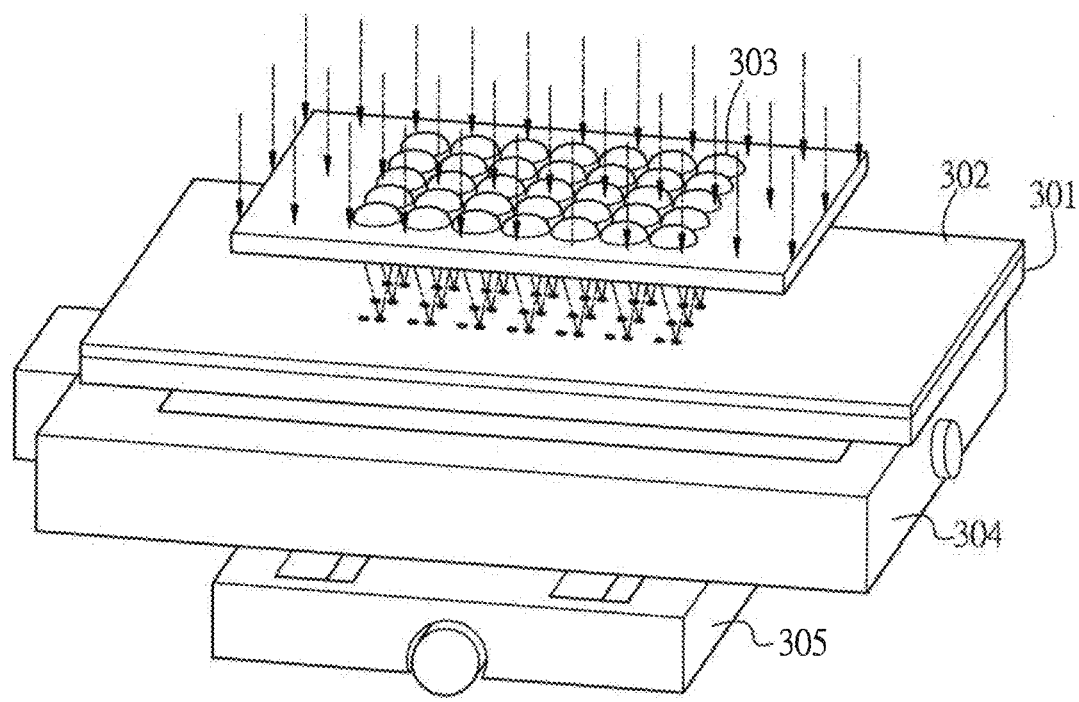

Besides, by the cooperation with the movement or rotation of the photoresist substrate, different energy distribution and different types of microstructure can be obtained. As shown in FIG. 13, a photoresist substrate 301 is disposed on platforms 304 and 305 that can move along X and Y axes and coated with a photoresist layer 302, and a laser light is focused to the photoresist layer 302 through a microlens unit 303. While the laser light (such as ultraviolet) illuminates the photoresist substrate 301 through the microlens unit 303, the platform 304 drives the photoresist substrate 301 to move according to a first direction for getting the energy distribution along the first direction, and then the platform 305 drives the photoresist substrate 301 to move according to a second direction perpendicular to the first direction for getting the energy distribution along the second direction. Thereby, the two-dimensional microstructure array can be manufactured.

Figure 14:
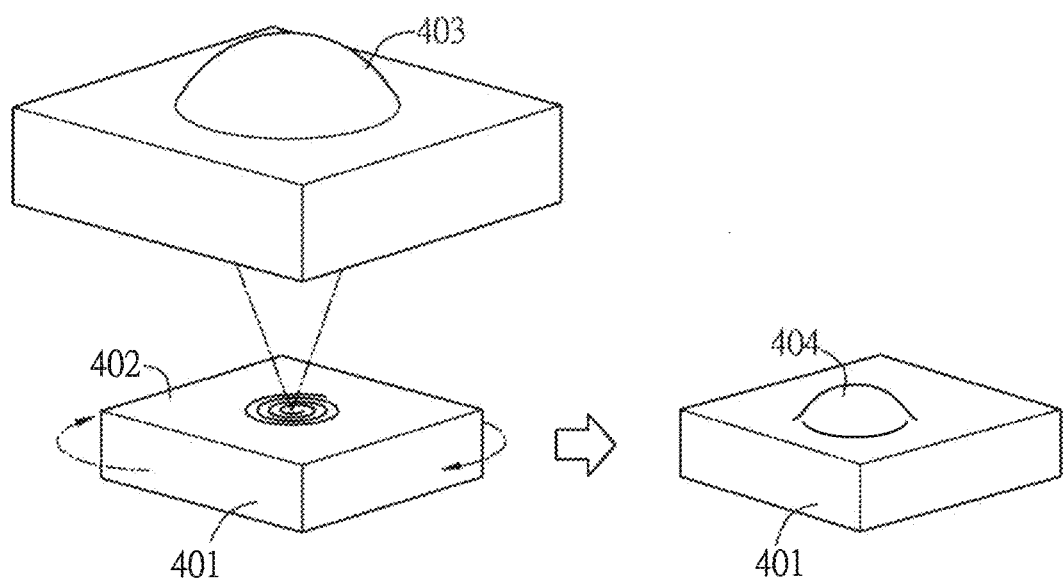

As shown in FIG. 14, a photoresist substrate 401 is coated with a photoresist layer 402, and a laser light is focused to the photoresist layer 402 through a microlens unit 403. While the laser light illuminates the photoresist substrate 401 through the microlens unit 403, the photoresist substrate 401 is driven to rotate on a plane. Thereby, the three-dimensional microstructure array 404 (only a single microstructure thereof is shown in FIG. 14) can be manufactured.

In addition to the above-mentioned microstructures, the manufacturing method of the microstructure of the invention also can manufacture a polyhedral microstructure, an axisymmetric microstructure, a pyramid microstructure, a light-guiding microstructure, an anti-counterfeiting microstructure, an optical reflective microstructure, or their any combination, or other microstructures. The axisymmetric microstructure is, for example, a bullet-type or steamed-bun-type axisymmetric microstructure. The polyhedral microstructure is, for example, a hexagonal pyramid microstructure, a multi-layer pyramid microstructure, or a multi-layer curviform microstructure.

In summary, in the manufacturing method according to the invention, different from the traditional art, the motion of a substrate relative to at least a photomask is determined in advance, such as including the angle and number of times of moving and rotating, and also the profile feature of a microlens unit to be formed on the substrate is determined. Then, a numerical analysis method is used to calculate and obtain the feature of the required photomask according to the determined motion of the substrate and the determined profile of the microlens unit so that the photomask can be manufactured according to the obtained feature of the photomask. After manufacturing the photomask, the substrate is driven to do the motion determined in the motion determination step, and meanwhile, a laser light is emitted to illuminate the substrate through the photomask, and then the microlens unit, i.e. expected microlens unit, will be formed on the substrate by the superposition effect of the laser light. Subsequently, by using the microlens unit with the photolithography process, the desirable microstructure can be manufactured in conformity with the requirement. Therefore, the applicability of the microstructure can be enhanced a lot.

Besides, the complexity of the microlens unit to be manufactured can be raised for the sake of the method of the invention, and therefore the microlens unit with more complexity such as an ellipse, a cone, a pyramid, a symmetric form or an asymmetric form can be manufactured. In addition, the number of dimensions of the dragging can be increased, and for example, three-time dragging can be used for getting more dimensions of the superposition effect contributed by the transparent area of the photomask. Thereby, the hexagonal close-packed microlens array can be manufactured, allowing the filling rate of the structure to be increased. The crucial point of the invention is, the microlens unit with the pre-designed profile can be accurately manufactured, thereby bringing enormous economic value and applicability.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of microstructure, the method being executed by a controller and comprising steps of:
   a motion determination step which determines the motion of a substrate relative to at least a photomask;
   a microlens determination step which determines the profile of a microlens unit on the substrate;
   an analysis step which calculates the feature of the photomask according to the motion of the substrate and the profile of the microlens unit by using a numerical analysis method;
   a production step which produces the photomask according to the feature of the photomask;
   driving the substrate to do the motion determined in the motion determination step, and meanwhile making a laser light illuminate the substrate through the photomask to manufacture the microlens unit on the substrate by the superposition effect of the laser light; and
   performing a photolithography process by using the microlens unit to produce a microstructure on a photoresist substrate.

2. The manufacturing method as recited in claim 1, wherein the motion of the substrate includes the angle and number of times of moving, the angle and number of times of rotating, or their combination.

3. The manufacturing method as recited in claim 1, wherein the motion determination step further determines the number of times of the substrate's motion relative to the photomask, and the analysis step calculates the feature of the photomask further according to the number of times by using the numerical analysis method.

4. The manufacturing method as recited in claim 1, wherein the substrate moves or rotates according to at least two directions relative to the photomask in the motion determination step, and two of the directions form an angle.

5. The manufacturing method as recited in claim 1, wherein the substrate moves or rotates at least two times relative to the photomask in the motion determination step.

6. The manufacturing method as recited in claim 1, wherein the substrate moves or rotates according to at least a direction relative to a plurality of the photomasks in the motion determination step.

7. The manufacturing method as recited in claim 1, wherein the substrate moves or rotates at least one time relative to a plurality of the photomasks in the motion determination step.

8. The manufacturing method as recited in claim 1, wherein the profile of the microlens unit includes an ellipse, a cone, a pyramid, an asymmetric form, an aspheric surface, an axisymmetric form, a cubic close-packed form, or their any combination.

9. The manufacturing method as recited in claim 1, wherein the profile is represented by at least an equation.

10. The manufacturing method as recited in claim 1, wherein the microlens unit is a microlens array.

11. The manufacturing method as recited in claim 10, wherein the microlens unit is a hexagonal close-packed microlens array.

12. The manufacturing method as recited in claim 10, wherein the microlens unit includes a plurality of aspheric microlenses.

13. The manufacturing method as recited in claim 12, wherein the aspheric microlenses include a plano-convex aspheric microlens, a biconvex aspheric microlens, or their combination.

14. The manufacturing method as recited in claim 1, wherein the numerical analysis method includes the simplex method.

15. The manufacturing method as recited in claim 1, further comprising the step of:
   a laser light determination step which determines the intensity and illumination time of a laser light, and the feature of the photomask is obtained by using the numerical analysis method further according to the intensity and the illumination time of the laser light in the analysis step.

16. The manufacturing method as recited in claim 1, wherein the photolithography process includes focusing a light into at least a light spot through the microlens unit, and the light spot falls on the photoresist substrate.

17. The manufacturing method as recited in claim 16, wherein the light spot approximates to the optical diffraction limit thereof.

18. The manufacturing method as recited in claim 1, wherein the photolithography process includes driving the photoresist substrate to move, rotate, or move and rotate according to at least a direction.

19. The manufacturing method as recited in claim 1, wherein the microstructure is a microstructure array.

20. The manufacturing method as recited in claim 1, wherein the microstructure includes a polyhedral microstructure, an axisymmetric microstructure, a pyramid microstructure, a light-guiding microstructure, an anti-counterfeiting microstructure, an optical reflective microstructure, or their any combination.

* * * * *